(12) United States Patent
Jackson et al.

(10) Patent No.: US 8,765,252 B2
(45) Date of Patent: Jul. 1, 2014

(54) THIN FILM DEVICE WITH MINIMIZED SPATIAL VARIATION OF LOCAL MEAN HEIGHT

(75) Inventors: Warren Jackson, Palo Alto, CA (US); Carl P. Taussig, Pala Alto, CA (US); Ping Mei, Pala Alto, CA (US); Albert Jeans, Pala Alto, CA (US); Han-Jun Kim, Pala Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 937 days.

(21) Appl. No.: 11/948,867

(22) Filed: Nov. 30, 2007

(65) Prior Publication Data
US 2009/0142560 A1 Jun. 4, 2009

(51) Int. Cl.
*B32B 7/02* (2006.01)
*B82Y 10/00* (2011.01)
*B82Y 40/00* (2011.01)
*G03F 7/00* (2006.01)

(52) U.S. Cl.
CPC ........... *B82Y 10/00* (2013.01); *B82Y 40/00* (2013.01); *G03F 7/0002* (2013.01); *B32B 7/02* (2013.01)
USPC .......................................................... 428/212

(58) Field of Classification Search
CPC ..................................................... B32B 7/02
USPC ............... 428/446, 212; 355/75; 264/293
See application file for complete search history.

(56) References Cited

U.S. PATENT DOCUMENTS

| | | | |
|---|---|---|---|
| 4,389,481 A * | 6/1983 | Poleshuk et al. | 438/160 |
| 6,808,646 B1 | 10/2004 | Jeans | |
| 6,861,365 B2 | 3/2005 | Taussig et al. | |
| 7,202,179 B2 | 4/2007 | Taussig et al. | |
| 7,295,288 B1 * | 11/2007 | Subramanian et al. | 355/75 |
| 2006/0063359 A1 * | 3/2006 | Stacey et al. | 438/494 |
| 2006/0254446 A1 * | 11/2006 | Lof | 101/466 |
| 2006/0269849 A1 * | 11/2006 | Lee | 430/5 |

OTHER PUBLICATIONS

Fujimoto et al. "Fabrication of Layer-by-Layer Self-Assembly Films Using Roll-to-Roll Process". Japanese Journal of Applied Physics, vol. 44, No. 3, (2005), pp. L126-L128.*

* cited by examiner

*Primary Examiner* — Prashant J Khatri

(57) ABSTRACT

This invention provides a thin film device with minimized spatial variation of local mean height. More specifically, the thin film device has a substrate and at least one first structure having a first spatially varying weighted local mean height determined by a layer weighting function. The first structure has a first maximum height, a first minimum height and a first variation for a given averaging area. A compensation structure is also provided upon the substrate, the compensation structure having a second spatially varying weighted local mean height determined by the layer weighting function. The compensation structure also has a second maximum height, a second minimum height and a second variation for the given averaging area. The first structure and compensation structure combine to provide a combined structure upon the substrate with minimized spatial variation of a combined weighted local mean.

20 Claims, 7 Drawing Sheets

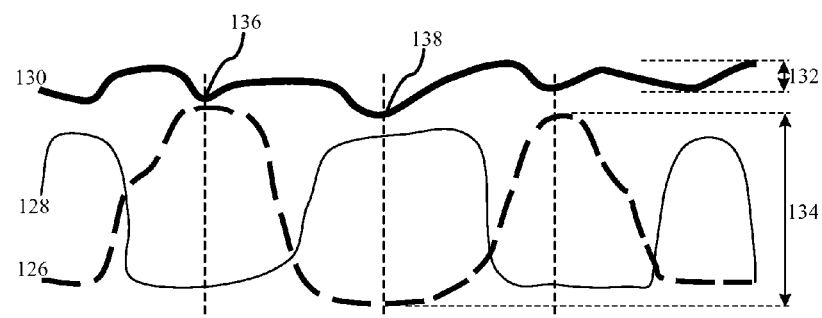
FIG. 2
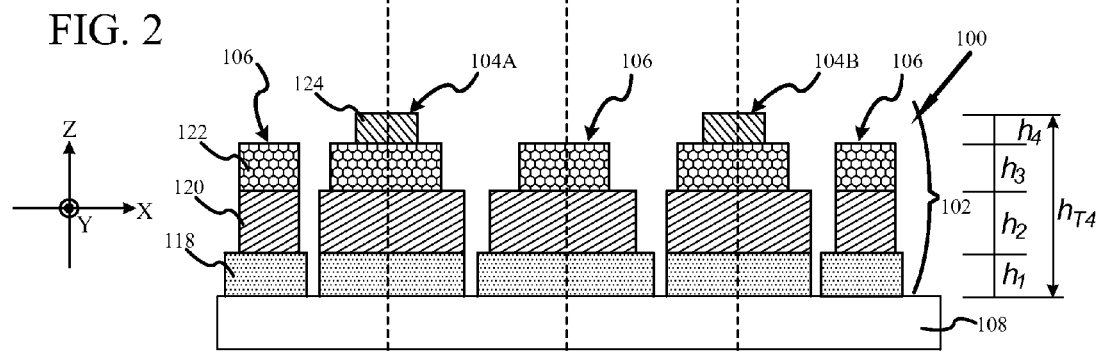
FIG. 3
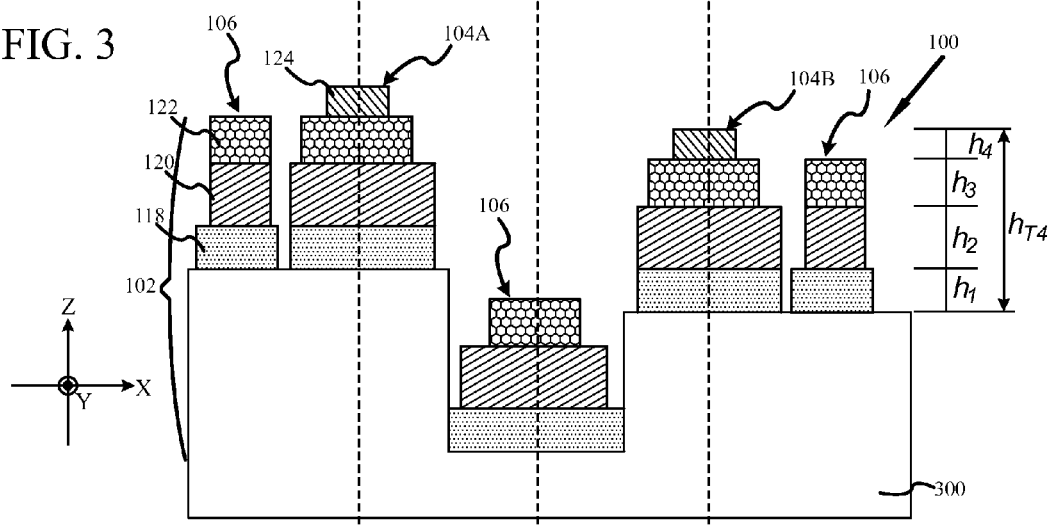

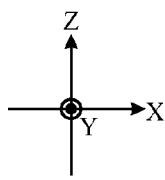
FIG. 10
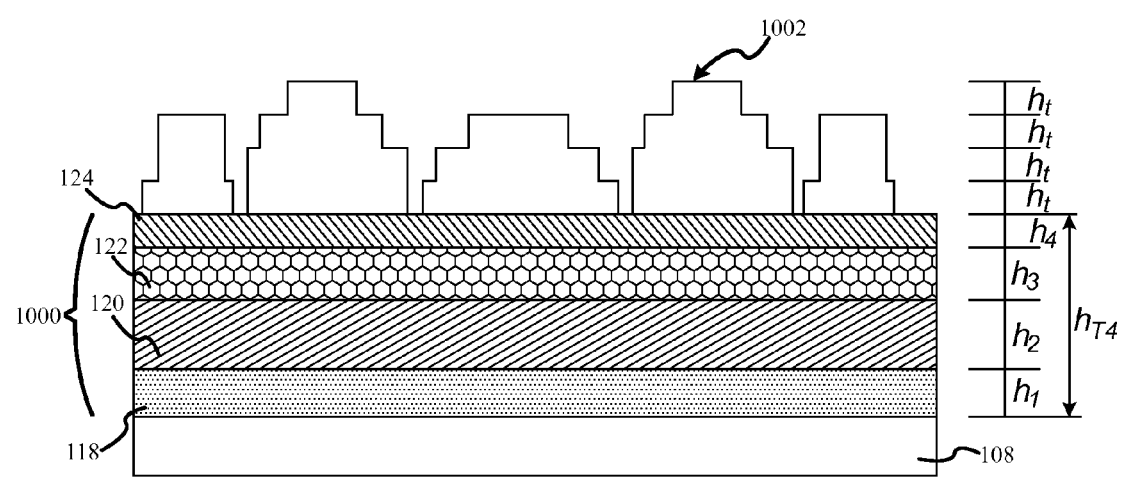

THIN FILM DEVICE WITH MINIMIZED SPATIAL VARIATION OF LOCAL MEAN HEIGHT

FIELD

This invention relates generally to the field of imprint lithography and, in particular, to resulting thin film devices with minimized spatial variation of local mean height. In particular such devices may be structured and arranged to minimize large scale fluid flow of the imprint liquid used to provide the imprint mask during device fabrication.

BACKGROUND

Socially and professionally, people in modern society rely more and more on electrical devices. Video displays in particular are increasingly common elements of professional and personal spaces appearing in cell phones, automated check-out lines, banking systems, PDAs, and of course displays for desktop and laptop computers and HDTV systems.

Especially for display devices, but also for other electronic devices, typically a plurality of thin film devices are incorporated into such devices. For displays, one or more transistors are commonly used to control the behavior of each pixel within the display. The individual nature of each pixel of an LED, plasma, electrophoretic, or LCD display introduces the possibility that each pixel may provide a different quantity of light. One pixel may be brighter or darker than another, a difference that may be quite apparent to the viewer. Circuit components such as logic gates and interconnects are typically used to control the transistors and or other components.

As a flat screen display may incorporate millions of thin film devices, great care is generally applied in the fabrication of LED, plasma and LCD displays in an attempt to ensure that the pixels and their controlling circuits are as uniform and consistently alike as is possible. Frequently, especially with large displays, quality control measures discard a high percentage of displays before they are fully assembled. As such, displays are generally more expensive than they otherwise might be, as the manufacturers must recoup the costs for resources, time and precise tooling for both the acceptable displays and the unacceptable displays.

Traditionally, thin film devices have been formed through processes such as photolithography. In a photolithographic process, a substrate is provided and at least one material layer is uniformly deposited upon the substrate. A photo-resist layer, also commonly known as a photoresist, or even simply a resist, is deposited upon the material layer, typically by a spin coating machine. A mask is then placed over the photoresist and light, typically ultra-violet (UV) light, is applied through the mask to expose portions of the photoresist. During the process of exposure, the photoresist undergoes a chemical reaction. Generally, the photoresist will react in one of two ways.

With a positive photoresist, UV light changes the chemical structure of the photoresist so that it is soluble in a developer. What "shows" therefore goes, and the mask provides a copy of the patterns which are to remain—such as, for example, the trace lines of a circuit. Photolithography may also be considered a 2D process, in that each layer of material is deposited and then masked. Although 3D structure may be created by stacking layers patterned via the 2D process, there is no inherent alignment feature between the layers.

A negative photoresist behaves in the opposite manner—the UV exposure causes it to polymerize and not dissolve in the presence of a developer. As such, the mask is a photographic negative of the pattern to be left. Following the developing with either a negative or positive photoresist, blocks of photoresist remain. These blocks may be used to protect portions of the original material layer, or serve as isolators or other components.

Very commonly, these blocks serve as templates during an etching process, wherein the exposed portions of the material layer are removed, such as, for example, to establish a plurality of conductive rows.

The morphology of the materials composing each material layer, and specifically the crystalline texture of each material at an interface between materials is often of significant importance to the operation of the thin film device. Surface defects and surface contaminants may negatively affect the interfaces between layers and possibly degrade the performance of the thin film device.

In addition, photolithography is a precise process applied to small substrates. In part this is due to the high cost of the photo masks. For the fabrication of larger devices, typically rather than employing a larger and even more costly photo mask, a smaller mask is repeatedly used—a process that requires precise alignment.

As a photolithographic process typically involves multiple applications of materials, repeated masking and etching, issues of alignment between the thin film layers is of high importance. A photolithographic process is not well suited for formation of thin film devices on flexible substrates, where expansion, contraction or compression of the substrate may result in significant misalignment between material layers, thereby leading to inoperable thin film devices. In addition a flexible substrate is not flat—it is difficult to hold flat during the exposure process and thickness and surface roughness typically can not be controlled as well as they can for glass or other non-flexible substrates.

The issue of flatness in photolithography can be problematic because the minimum feature size that can be produced by a given imaging system is proportional to the wavelength of the illumination divided by the numerical aperture of the imaging system. However the depth of field of the imaging system is proportional to the wavelength of the illumination divided by the square of the numerical aperture. Therefore as resolution is increased the flatness of the substrate quickly becomes the critical issue.

With respect to the flat screen displays introduced above, use of flexible substrates for the internal backplane controlling the pixels is often desired. Such a flexible substrate can provide a display with flexible characteristics and significant weight reduction for mobile applications. A flexible substrate may also be easier to handle during fabrication and provide a more mechanically robust display for the user.

In addition, many thin film devices involve components that rely on crossovers, as in one conductor crossing over another conductor, or the isolation of one or more internal layers from other layers. One type of fabrication method that has been advancing is roll-to-roll processing. Roll-to-roll processing provides continuous steady state processing with high throughput. In addition, as the imprinting template used to define the desired thin film structures is a continuous pattern provided by cylinder, in most instances roll-to-roll systems can be provided in smaller physical spaces, thereby permitting smaller clean room environments and reduced equipment costs. As roll-to-roll processing involves a flexible substrate, the alignment of features and establishing crossover isolation can be somewhat challenging.

The mask used in a roll-to-roll process is typically provided by an imprint polymer. Deposited in liquid form and then imprinted to define the desired structure, an issue that frequently arises is that of fluid flow. More specifically, the liquid imprint polymer must flow into some areas of the imprint template and away from other areas of the imprint template. To facilitate speed and reliability of repetitive imprinting it is desirable to limit the distance that the fluid must flow. If there is excess imprinting fluid in one or more areas the result is likely to be that some or all polymer layers will be thicker then expected. Conversely if there is insufficient imprint liquid in one or more areas the result is that some or all of the polymer layers will be thinner then expected. As the thickness or thinness of one or more polymer layers directly correlate to the resulting structures, errant instances of inappropriate thinness or thickness may adversely affect the resulting thin film device.

Hence, there is a need for a thin film device that overcomes one or more of the above identified shortcomings.

SUMMARY

This invention provides a thin film device with minimized spatial variation of local mean height.

In particular, and by way of example only, according to an embodiment, provided is a thin film device with minimized spatial variation of local mean height including: a substrate; at least one first structure having a first spatially varying weighted local mean height determined by a layer weighting function, the at least one first structure having a first maximum, a first minimum and a first variation for a given averaging area; and at least one compensation structure having a second spatially varying weighted local mean height determined by the layer weighting function, having a second maximum, a second minimum and a second variation for the given averaging area, the first structure and compensation structure combining to provide a combined structure upon the substrate with minimized spatial variation of a combined weighted local mean.

According to yet another embodiment, provided is a thin film device including: a plurality of vertically stacked thin film layers disposed upon a substrate and patterned to provide at least one combined structure, the combined structure including: a moving weighted height average above the substrate; at least one first structure having a first spatially varying weighted local mean height determined by a layer weighting function; and at least one compensation structure having a second spatially varying weighted local mean height determined by the layer weighting function; wherein for one or more common thin film layers comprising both the at least one first structure and the at least one second structure, the common layers have the same layer height in each structure.

BRIEF DESCRIPTION OF THE DRAWINGS

FIG. 2 is a cross sectional side view of the TFD shown in FIG. 1 according to an embodiment of the present invention;

FIG. 3 is a cross sectional side view of the TFD shown in FIG. 1 according to an alternative embodiment of the present invention;

FIG. 10 is a side view of a plurality of thin film layers and a 3D template mask for patterning the layers to provide the TFD as shown in FIG. 1 according to an embodiment of the present invention.

DETAILED DESCRIPTION

Before proceeding with the detailed description, it is to be appreciated that the present teaching is by way of example, not by limitation. The concepts herein are not limited to use or application with a specific thin film device. Thus, although the instrumentalities described herein are, for the convenience of explanation, shown and described with respect to exemplary embodiments, it will be appreciated that the principles herein may be equally applied in other types of thin film device settings.

Figure 1:
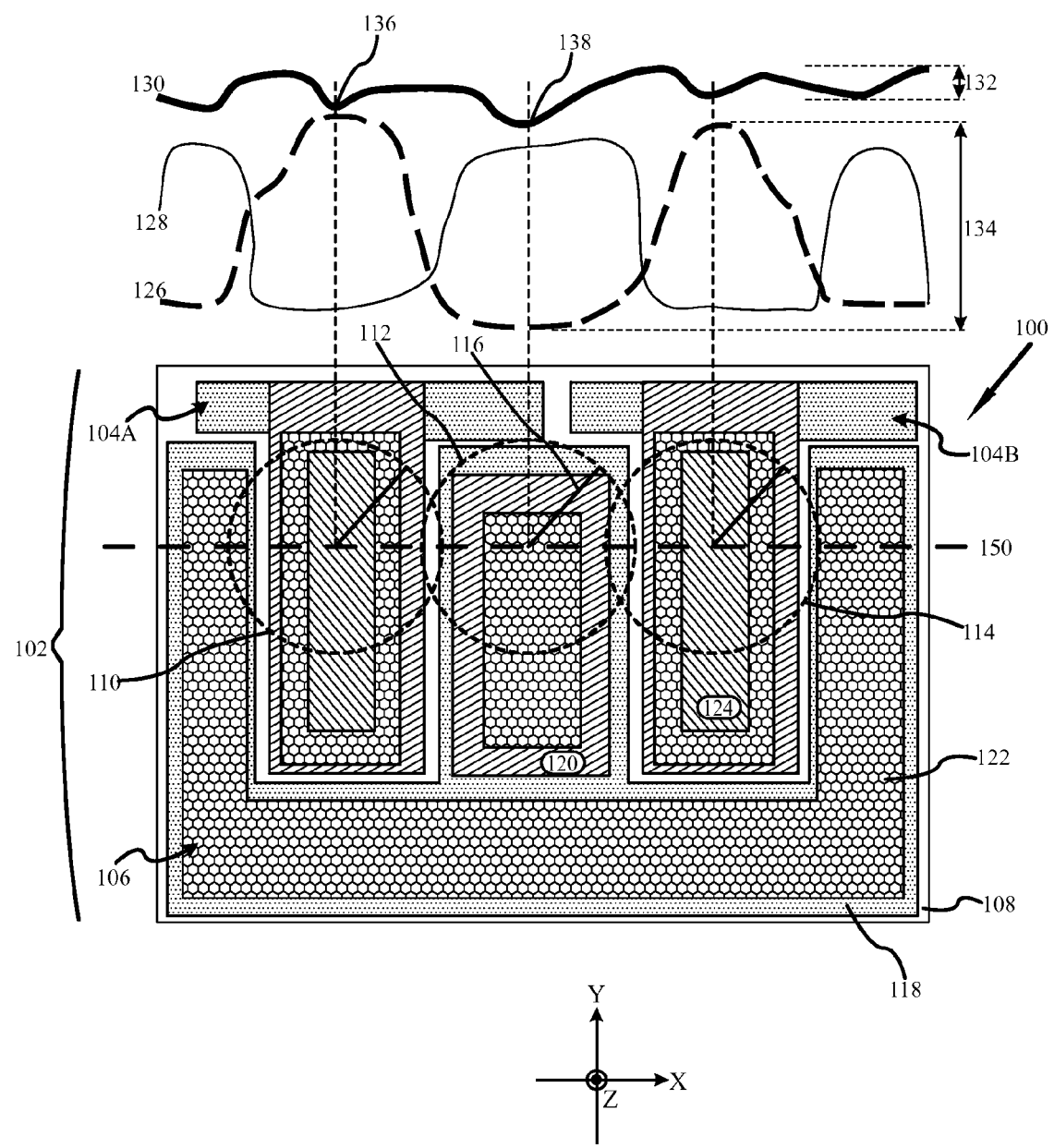
FIG. 1 is top view of a TFD (Thin Film Device) with minimized spatial variation of local mean height as provided by the combined structure of at least one first structure and a compensation structure according to an embodiment of the present invention.

Turning now to the figures, and more specifically FIG. 1, there is shown a top view of an exemplary thin film device ("TFD") 100 with minimized spatial variation of local mean height provided as a combined structure 102 with at least one first structure 104 and at least one compensation structure 106 upon substrate 108. In at least one embodiment, the method for forming the TFD 100 incorporates Self-Aligned Imprint Lithography ("SAIL"), a recently developed technique for producing multilayer patterns on flexible substrates. The basics of this process are set forth and described in U.S. Pat. No. 6,861,365, entitled "Method and System for Forming a Semiconductor Device" the disclosure of which is incorporated herein by reference.

The SAIL process involves depositing a liquid imprint polymer substrate and or a plurality of thin film layers previously deposited upon a substrate, and imprint the liquid imprint polymer to provide a 3D structure mask having a plurality of different vertical heights. As the imprint polymer is initially liquid, liquid level control structures are integrated into the template mask so as to reduce variations in the spatially varying local mean height. As such, large scale fluid flow from one area to another is advantageously minimized, and by implication so to are the instances of overfill and/or under fill.

It is of course understood that so as to permit proper structure and arrangement of the liquid level control structures for use in establishing the 3D polymer template, the TFD 100 is advantageously structured and arranged to itself have a moving weighted height average with minimized spatial variation. As shown in FIG. 1, TFD 100 advantageously achieves this condition by incorporating combined structure 102 formed by the combination of at least one first structure 104, of which structures 104A and 104B are exemplary, and at least one compensation structure 106.

Also shown in FIG. 1 are three area locations, 110, 112 and 114 bounded by dotted lines and each having a radius 116.

Areas 110 and 114 are shown centered upon a portion of structures 104A and 104B respectively and area 112 is shown centered upon a portion of compensation structure 106.

As FIG. 1 is a top view, e.g., against the YX-plane, the relative heights of first structures 104A, 104B and compensation structure 106, as well as the ordered arrangement of the thin film layers 118, 120, 122 and 124 is more easily appreciated in FIG. 2. FIG. 2 is a cross section view of the combined structure 102 of TFD 100 shown in FIG. 1, along dotted line 150, which further illustrates that TFD 100 has a plurality of stacked thin film layers 118, 120, 122 and 124.

The use of four layers as shown has been selected for ease of discussion and illustration and is not suggestive of a limitation. Indeed the type and composition of each layer, as well as the total number of layers provided is a matter of design choice for the type of TFD actually desired. For example, if TFD 100 is to be or at least include a cross over, in at lest one embodiment there will be a bottom metal layer 118, a dielectric layer 120, a semiconductor layer 122 and a top metal layer 124.

As shown in FIG. 2, although the height of each layer is uniform for a given layer, each layer may have a height different each other layer. More specifically, $h_1$ of layer 118 is less than $h_2$ of layer 120, and greater than $h_4$ of layer 124. TFD 100 has a total height equal to $h_{T4}$. As shown in FIG. 2, the substrate 108 is substantially planar. However, it should be understood and appreciated that a non-planar substrate 300 may also be used. Indeed, FIG. 3 is a cross section view of an alternative embodiment of the combined structure 102 of TFD 100 shown in FIG. 1 wherein the substrate 300 is non-planar. The same height relationships shown with respect to FIG. 2 are present in FIG. 3.

Correlated to FIG. 1 is a graph of a first spatially varying weighted local mean heights of structures 104A and 104B, shown as dotted line 126 and a second spatially varying weighted local mean height of compensation structure 106, shown as a light line 128. The combined weighted local mean height is shown as heavy line 130.

Figure 4:
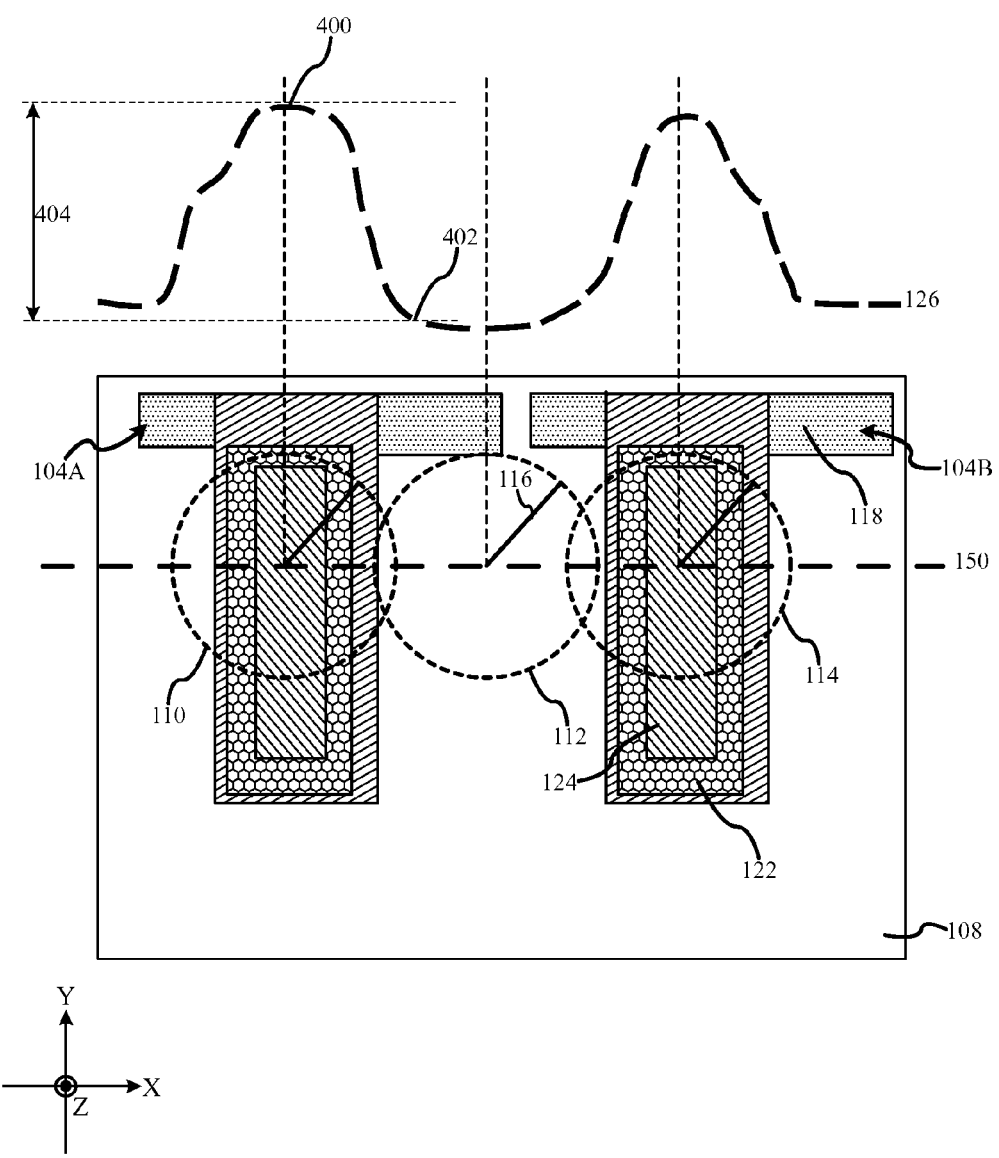
FIG. 4 is a top view of the at least one first structure shown in FIG. 1 according to an embodiment of the present invention.
Figure 5:
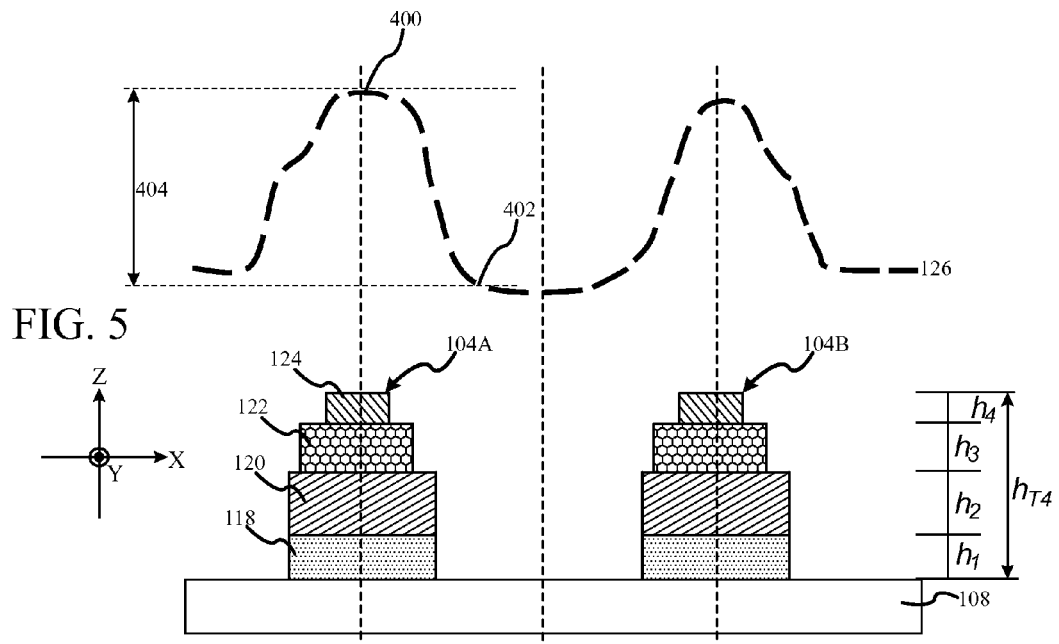
FIG. 5 is a cross sectional side view of the at least one first structure shown in FIG. 4 according to an embodiment of the present invention.
Figure 6:
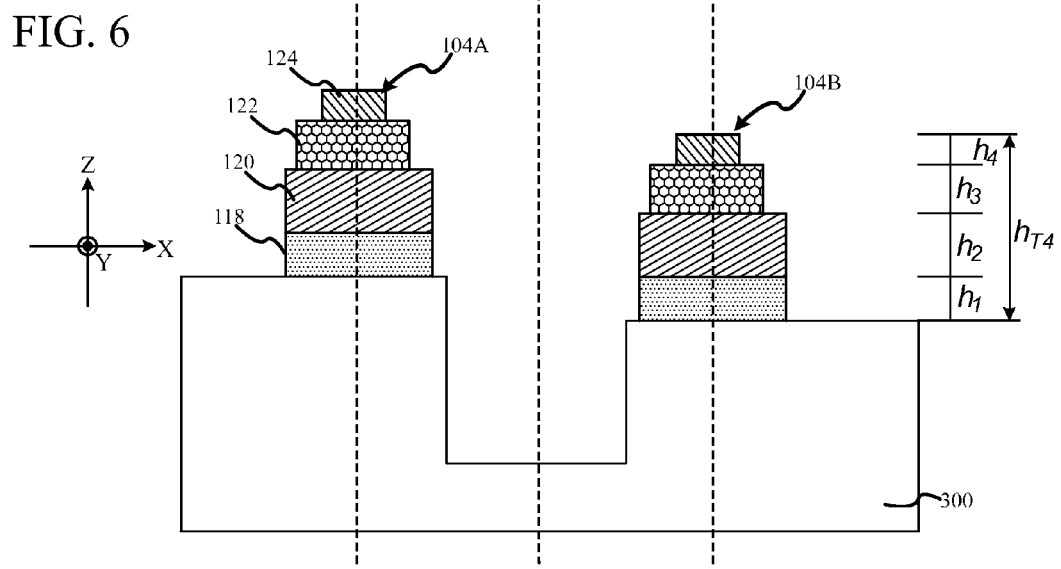
FIG. 6 is a cross sectional side view of the at least one first structure shown in FIG. 4 according to an alternative embodiment of the present invention.
Figure 7:
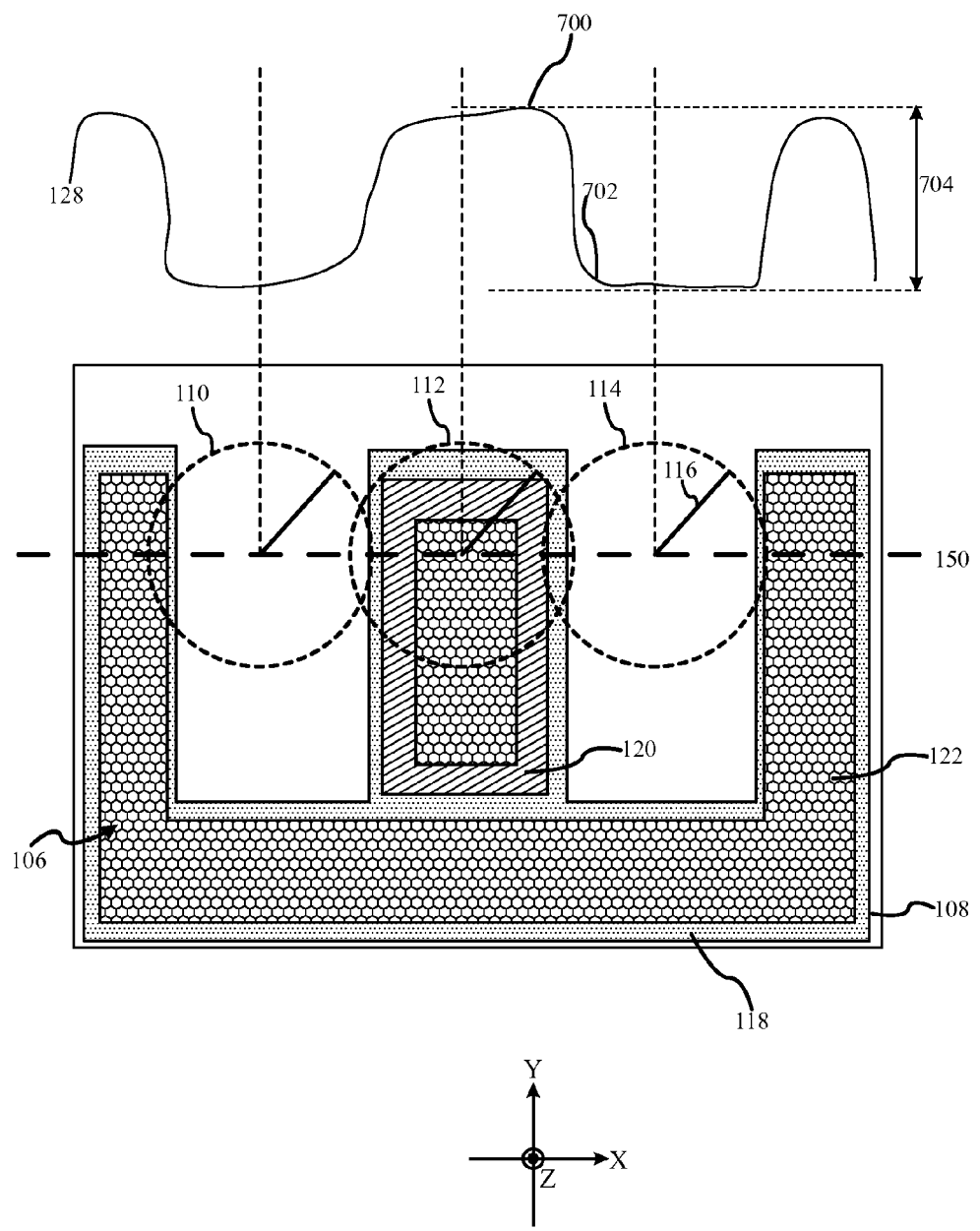
FIG. 7 is a top view of the at least one compensation structure shown in FIG. 1 according to an embodiment of the present invention.
Figure 8:
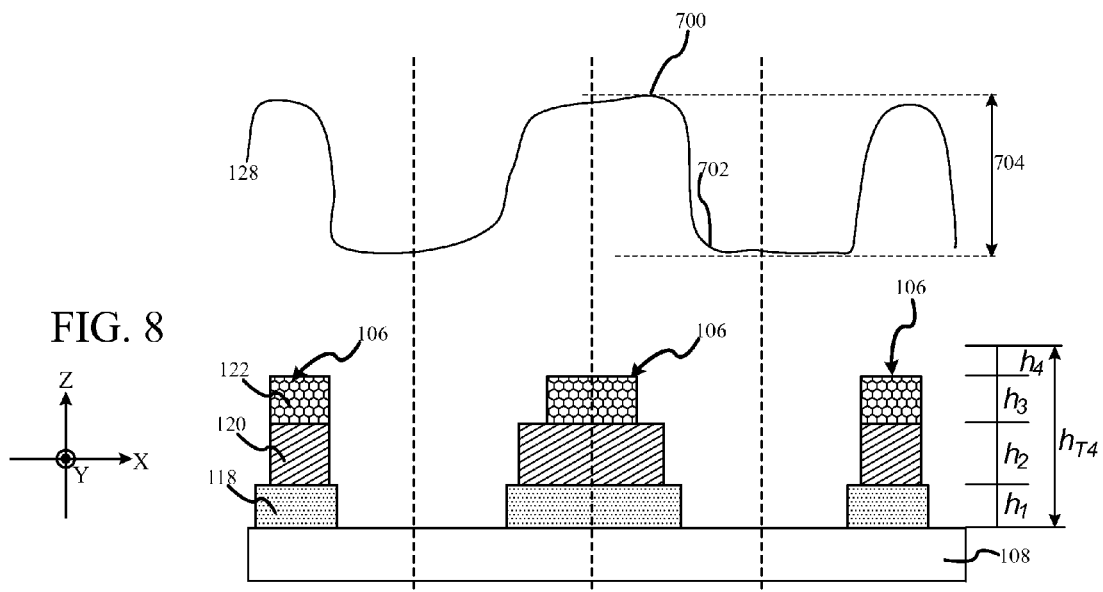
FIG. 8 is a cross sectional side view of the at least one compensation structure shown in FIG. 7 according to an embodiment of the present invention.
Figure 9:
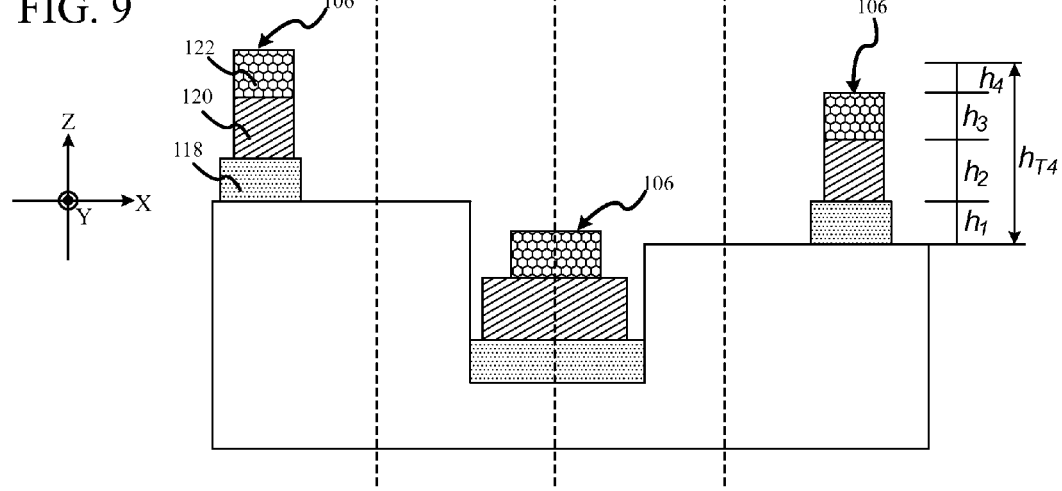
FIG. 9 is a cross sectional side view of the at least one compensation structure shown in FIG. 7 according to an alternative embodiment of the present invention.

To more fully appreciate the aspects of these structures, FIGS. 4-6 provide illustration of the first structures 104A, 104B, and FIGS. 7-9 provide illustration of the compensation structure 106. FIG. 4 is a top view against the YX-plane of the first structures 104A, 104B upon the substrate. With respect to the first spatially varying weighted local mean height 126, it is appreciated that for a given averaging area, e.g., area 110, the first structures have a maximum weighted local mean height 400 and a minimum weighted local mean height 402, which define a weighted local mean variation range 404 for the given averaging area 110.

FIG. 5 provides a cross section side view of the first structures 104A, 104B of FIG. 4 in one embodiment where the substrate is a planar substrate 108. FIG. 6 provides a corresponding cross section side view of the first structures 104A, 104B of FIG. 4 in an alternative embodiment where the substrate is a non-planar substrate 300.

FIG. 7 is a top view against the YX-plane of the compensation structure 106 upon the substrate. With respect to the second spatially varying weighted local mean height 128, it is appreciated that for a given averaging area, e.g., area 112, the compensation structure 106 has a maximum weighted local mean height 700 and a minimum weighted local mean height 702 which define a variation range 704 for the given averaging area 110.

FIG. 8 provides a cross section side view of the compensation structure 106 of FIG. 7 in one embodiment where the substrate is a planar substrate 108. FIG. 9 provides a corresponding cross section side view of the compensation structure 106 of FIG. 7 in an alternative embodiment where the substrate is a non-planar substrate 300.

With respect to FIGS. 4 and 7 it is appreciated that the first and second local mean heights 126, 128 cooperatively combine as shown in FIG. 1 to provide the combined structure 102 with a minimized spatial variation 132 (see FIG. 1). Moreover, the range of spatial variation 132 of the combined weighted height average is a fraction of the variation range 134 present with the first and second spatially varying weighted local mean heights 126 and 128 of the first structures 104 and compensation structures 106 respectively. To summarize, in at least one embodiment, the combined local mean minimizes the difference between combined local maximum and local minimum heights.

This is further exemplified through a comparison of various averaging areas. For example, in averaging area 110, e.g., a first averaging area location, the first structure 104A has a weighted local mean height (first weighted local mean). In averaging area 112, e.g., a second averaging area location, the first structure 104A has another weighted local mean height (second weighted local mean). Similarly, the compensation structure 106 has a weighted mean height for the first averaging area 110 at the first location (third weighted local mean) and a weighted local mean height for the second averaging area 112 at the second location (fourth weighted local mean).

As a combined structure 102, the first and third weighted local means combine to provide a first combined weighted local mean height 136 in first averaging area 110. Likewise, the second and fourth weighted local means combine to provide a second combined weighted local mean height 138 in second averaging area 112. As indicated, the first combined weighted local mean height 136 is about equal to the second combined weighted local mean height 136.

Moreover, in at least one embodiment, TFD 100 has a substrate 108/300 and disposed thereon is at least one first structure 104 having a first spatially varying weighted local mean height 126 determined by a layer weighting function. For a given averaging area, e.g., area 110, this local mean height 126 has a maximum, a minimum and a variation there between. At least one compensation structure 106 is also disposed upon the substrate 108/300 having a second spatially varying weighted local mean height 128 determined by a layer weighting function. For a given averaging area, e.g., area 110, this local mean height 128 also has a maximum, a minimum and a variation there between. The at least one first structure 104 and the compensation structure 106 combine to provide a combined structure 102 upon the substrate 108/300 with minimized spatial variation of the combined weighted local mean.

In the above description the local mean heights are discussed as being weighted. In at least one embodiment the weighting factor applied is a factor of one "1". However, in other embodiments the weighting element is provided by a function and is employed to advantageously permit the compensation structure to optimize various desirable characteristics of the combined structure. For example, in at least one embodiment, the weighting factor would be used to minimize the flow of the imprint polymer during the imprint process. In this case, the weighting factor for each level i would be the ratio of the height of the level in the imprint stamp use to fabricate level i to the final structure height for level i.

In another embodiment, the weighting factor is used to optimize the compensation structure to compensate for stress buildup in layered structures on flexible substrates. If the desired structure has unavoidable stress which causes the flexible substrate to curl, the compensation structure can be designed to minimize the overall net curvature of the substrate. In this case the weighting factor for each level would represent the ratio of the local net strain caused by each level to the final structure height. The compensation structure minimizing the weighted local average would minimize the overall strain in the device.

Other embodiments of the weighting factor might be to enable the compensation structure with the desired structure to achieve a desired color or visual appearance. In summary, the weighting factor is selected optimize characteristics of the combined structure compared to the characteristics of the desired structure.

With respect to FIGS. 1-9, the heights of the structures (e.g., the first structures 104A, 104B and compensation structure 106) relative to the substrate is $h_j, j=1,2 \ldots N$ where N is the number of layers. For the exemplary embodiment shown in FIGS. 1-9, N=4. The weighting function in many cases can be taken to be a linear function related to the layer thicknesses with offset $o_j$ factor and a multiplication factor $w_j$ such that in at least one embodiment the weighting function is:

$$f(h_j) = w_j h_j + o_j$$

A distance, d defines an averaging circle of radius d 116 and an averaging area $A_d = \pi d^2$. The weighted local mean height centered, H(x) at position x averaged over $A_d$ relative to the substrate is given by:

$$H(x) = \sum_i A_i(x) f(h_i) / A_d = \sum_i A_i(x)[w_i h_i + o_i] / A_d$$

where $A_i(x)/A_d$ is the fraction of the area at height h with the averaging area $A_d$ centered at x. Moreover, the sum of the total is:

$$\sum_i A_i(x) = A_d$$

The height variance of the local weighted average is given by:

$$S = \int_{imprint\ area} (H(x) - \langle H \rangle)^2 dA$$

where $$\langle H \rangle = \int_{imprint\ area} (H(x)) dA / A$$

$$H_{max} = \max_x H(x)$$

$$H_{min} = \min_x H(x)$$

With respect to these equations, <H> is the weighted average height above the substrate for the different structures, $H_{max}$ is the maximum weighted local mean and $H_{min}$ is the minimum weighted local mean. The compensation layer is selected to minimize the spatial variation of H(x) either by minimizing S or minimizing $|H_{max} - H_{min}|$ for a fixed averaging area $A_d$ and weighting function defined by $\{w_j, o_j, j=1 \ldots N\}$.

The averaging area radius can be any value but beneficially it can be equal to the fluid transport distance during the imprint process or the critical stress radius. Moreover, in at least one embodiment the averaging area is determined as the diffusion distance of the imprint polymer that is to be used in providing the 3D template structure to be used in the formation of TFD 100, and more specifically the combined structure 102 of TFD 100.

The weighting function is selected depending on the application for TFD 100. In at least one embodiment, the weighting function is selected so that compensation structure 106 when combined with the first structure 104 minimizes the fluid flow of imprint polymer during the imprint process. In this case $\{w_j, o_j, j=1 \ldots N\}$ can be selected to represent the height above the material stack for each layer in the imprint mask. In other words, $w_j$, $o_j$ can be selected so that $h^{imprint}_j = w_j h^{layer}_j + o_j$.

For an embodiment wherein $w_j$, $o_j$ are so selected, the template portion defining the compensation structure 106 will advantageously achieve flow balance during the imprint process. In alternative embodiments, other values of $w_j$, $o_j$ may be selected in order that the compensation structure 106 compensates for built in stress, external applied stress, and/or curvature.

FIG. 10 illustrates a cross section view of a plurality of vertically stacked thin film layers 1000 disposed upon substrate 108. As shown, each layer is continuous and un-patterned. A 3D template structure 1002 has been disposed upon the top of the thin film layers 1000. Template structure 1002 has been formed in accordance with the above equations such that the resulting combined structure 102 of TFD 100 will conform to the above described properties. In at least one embodiment, the vertical height differences between elevations in the 3D template structure 1002 are uniformly constant, $h_t$, whereas the heights of the individual thin film layers are different.

As each of the layers is initially a continuous layer, several elements of construction may be appreciated. For example, each layer has a substantially uniform thickness relative to itself. Additionally, as each layer is indeed a continuous layer, the ordered arrangement of the layers in one area is the same as in any other layer, as the layers immediately above and below any given layer do not change in sequence.

Although FIG. 10 is rendered to illustrate a planar substrate 108, it is understood and appreciated that in alternative embodiments, the vertically stacked thin film layers 1000 are deposited over a non-planar substrate such as non-planar substrate 300 shown in FIG. 3. In addition, in at least one alternative embodiment, the substrate, planar or non-planar, has at least one pre-existing structure previously established upon the substrate prior to the deposition of the vertically stacked thin film layers 1000.

Following the patterning into the at least one first structure 104 and at least one compensation structure 106 as discussed above, the initial construction elements of the vertically stacked and continuous layers remain. Most specifically, for one or more common thin film layers comprising both a first structure 104 and a compensation structure 106, the common layers have the same layer height in each respective structure, see FIGS. 2 and 3. In addition the order of the remaining layers remains consistent. Although undercutting may be performed to remove portions of one or more lower layers, the common vertical neighbors of any given layer in one structure will be the same possible common vertical neighbors for the same layer in any other structure.

Moreover, in at least one embodiment, TFD 100 may be described as a plurality of vertically stacked thin film layers 1000 patterned to provide at least one combined structure 102 upon a substrate 108/300. The combined structure 102 has a moving weighted height average above the substrate 108/300, which is provided by at least one first structure 104 having a first spatially varying weighted local mean height 126 and a compensation structure 106 having a second spatially varying weighted local mean height 128. For one or more common thin film layers comprising both the at least one first structure 104 and the at least one second structure 106, e.g., layers 118, 120 and 122, the common layers have the same layer height in each structure.

As shown in FIGS. 1-9, in at least one embodiment, at least one compensation structure 106 is disposed adjacent to at least one first structure 104. Moreover, in at least one embodiment, the first structures 104 are intended to be the desired elements of the functional TFD 100 and the compensation structures 106 are established simply to facilitate the advantageous properties of minimized spatial variation of the combined structure. Of course, in at least one alternative embodiment these properties are reversed such that the compensation structures 106 are the desired functional elements of the TFD. Indeed the applied terms of first structure and compensation structure have been employed herein for ease of discussion and illustration and are not intended to suggest or imply a limitation as to the ultimate intent of each structural element (first structure 104 or compensation structure 106) within the TFD 100.

It is also to be understood and appreciated that in at least one embodiment, at least one compensation structure 106 is integrated into at least one first structure 104. Moreover, in establishing the structure and arrangement of the TFD 100, elements such as gate contacts, electrodes, conductive lines, isolators, or any other structure may be structured and arranged so as to incorporate properties of both a first structure 104 and a compensation structure 106. For example a conductive line may have disposed within it's cross section a number of compensation structures 106 in the form of physical voids—which do not affect the conductivity of the conductive line.

Indeed it is to be understood and appreciated that compensation structures 106 may take many forms and shapes. In at least one embodiment, the compensation structures 106 are selected from the group of physical voids, areas of one or more vertically stacked thin film layers and combinations thereof. Further, as the compensation structures 106 and first structures 104 are, in at least one embodiment, the resulting structures from roll-to-roll processing, in at least one embodiment the first structures 104 and compensation structures 106 are structured and arranged for reliable fabrication by a repetitive imprinting process.

Further still, it is understood and appreciated that in at least one embodiment, at least one additional layer of material is deposited upon at least a portion of the combined structure. For example, in at least one embodiment, a dielectric layer coating is provided upon the combined structure 102 so as to insulate and/or protect the combined structure 102. Alternative layers with different properties may also be applied for different purposes.

Changes may be made in the above methods, systems, processes and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A thin film device with minimized spatial variation of local mean height comprising:
    a substrate;
    at least one first structure disposed on a first area of the substrate, the at least one first structure having a first spatially varying weighted local mean height determined by a layer weighting function, the at least one first structure having a first maximum, a first minimum and a first variation for a given averaging area; and
    at least one compensation structure disposed on a second area of the substrate separate from the first area, the at least one compensation structure having a second spatially varying weighted local mean height determined by the layer weighting function, having a second maximum different than the first maximum, a second minimum, and a second variation for the given averaging area, the first structure and compensation structure combining to provide a combined structure upon the substrate with minimized spatial variation of a combined weighted local mean height;
    wherein a plurality of vertically stacked thin film layers are stacked upon each other, and are patterned to define the at least one compensation structure and the at least one first structure, for at least two common thin film layers comprising both the at least one first structure and the at least one compensation structure has a uniform layer height in each structure, and wherein the first of the at least two common layers is disposed directly on the substrate.

2. The thin film device of claim 1, wherein at least one compensation structure is disposed adjacent to at least one first structure.

3. The thin film device of claim 1, wherein the combined local mean minimizes the difference between combined local maximum and the local minimum.

4. The thin film device of claim 1, wherein the at least one compensation structure and the at least one first structure are structured and arranged for reliable fabrication.

5. The thin film device of claim 1, wherein the substrate has pre-existing structures.

6. The thin film device of claim 1, wherein the substrate is non-planar.

7. The thin film device of claim 1, further including at least one additional layer of material disposed upon at least a portion of the combined structure.

8. A thin film device with minimized spatial variation of local mean height comprising:
    a substrate;
    at least one first structure disposed upon the substrate in a first area;
    at least one compensation structure disposed upon the substrate in a second area separate from the first area; and
    a first averaging area at a first location including a portion of the at least one first structure and a second averaging area at a second location including a portion of the at least one compensation structure, the second averaging area equal to the first averaging area, the first structure and the compensation structure combining in each averaging area to provide a combined structure having a first combined weighted local mean height for the first location about equal to a second combined weighted local mean height for the second location;
    wherein a plurality of vertically stacked thin film layers are patterned to define the at least one first structure and the at least one compensation structure, and wherein each layer is stacked upon each other, and wherein each of the layers that extends within both of the at least one first structure and the at least one compensation structure has a height that is uniform in both of the at least one first structure and the at least one compensation structure.

9. The thin film device of claim 8, wherein the at least one first structure has a first weighted local mean height determined by a layer weighting function for the first averaging area at the first location and a second weighted local mean height for the second averaging area at the second location, the at least one compensation structure having a third weighted local mean height for the first averaging area at the first location and a fourth weighted local mean height for the second averaging area at the second location.

10. The thin film device of claim 8, wherein at least one compensation structure is disposed adjacent to at least one first structure.

11. The thin film device of claim 8, wherein the variation between the first combined local mean height and the second combined local mean height is less than variation between a spatially varying local mean height of the first structure and a spatially varying local mean height of the compensation structure.

12. The thin film device of claim 8, wherein each given area is determined as the diffusion distance of an imprint polymer.

13. The thin film device of claim 8, wherein the substrate is non-planar.

14. The thin film device of claim 8, wherein the substrate is flexible.

15. A thin film device comprising:
a plurality of vertically stacked thin film layers disposed upon a substrate and patterned to provide at least one combined structure, the combined structure including:
a moving weighted height average above the substrate;
at least one first structure having a first spatially varying weighted local mean height determined by a layer weighting function; and
at least one compensation structure having a second spatially varying weighted local mean height determined by the layer weighting function;
wherein for one or more common thin film layers comprising both the at least one first structure and the at least one compensation structure, the common layers have the same layer height in each structure,
wherein each layer of the vertically stacked thin film layers is stacked upon each other with the common layers disposed first, and
wherein the at least one first structure comprises the functional thin film device and the at least one compensation structure is configured to minimize the spatial variation of the combined structure.

16. The thin film device of claim 15, wherein the weighted height average has a first range of variation, the first and second spatially varying weighted local mean heights having a second range of variation, the first range of variation being a fraction of the second range of variation.

17. The thin film device of claim 15, wherein at least one compensation structure is integrated into at least one first structure.

18. The thin film device of claim 15, wherein the substrate has pre-existing structures.

19. The thin film device of claim 15, wherein the substrate is non-planar.

20. The thin film device of claim 15, wherein the substrate is flexible.

\* \* \* \* \*